United States Patent [19]

Neuhouser

[11] Patent Number: 5,051,733
[45] Date of Patent: Sep. 24, 1991

[54] HIGH VOLTAGE INDICATOR DEVICE
[75] Inventor: Donald Neuhouser, Grove City, Ohio
[73] Assignee: Service Machine Company, Huntington, W. Va.
[21] Appl. No.: 528,734
[22] Filed: May 23, 1990
[51] Int. Cl.[5] .............................................. G08B 21/00
[52] U.S. Cl. ..................................... 340/660; 340/654; 324/133; 174/73.1
[58] Field of Search ................ 340/654, 660; 324/126, 324/127, 133, 402, 530, 630, 690; 174/73.1

[56] References Cited
U.S. PATENT DOCUMENTS

| | | |
|---|---|---|
| 1,913,155 | 6/1933 | Ferguson . |
| 3,039,013 | 6/1962 | Wilmotte . |
| 3,178,697 | 4/1965 | Albright . |
| 3,229,274 | 1/1966 | Riley et al. . |
| 3,328,690 | 6/1967 | Lockie et al. . |
| 3,524,133 | 8/1970 | Arndt . |
| 3,692,922 | 9/1972 | Sugimoto et al. .................. 174/73.1 |
| 3,744,045 | 7/1973 | Frink et al. . |
| 3,964,039 | 6/1976 | Craford et al. . |
| 3,970,932 | 7/1976 | Harvey ............................... 324/133 |
| 3,991,367 | 11/1976 | Chapman et al. .................. 324/133 |
| 4,197,484 | 4/1980 | Tanaka . |
| 4,609,914 | 9/1986 | Fathi .................................... 340/660 |
| 4,755,805 | 7/1988 | Chau .................................... 340/662 |
| 4,814,933 | 3/1989 | Filter et al. ........................... 361/86 |

Primary Examiner—Donnie L. Crosland
Assistant Examiner—Jeffery A. Hofsass
Attorney, Agent, or Firm—McCaleb, Lucas & Brugman

[57] ABSTRACT

Safety apparatus for indicating a live voltage condition in an insulated electrical conductor having insulation surrounding a central conductor wire, comprises: a layer of semi-conducting tape on the outer surface of the insulation; an electrically conductive sheath consisting of a plurality of turns of wire on the outer surface of the semi-conducting tape; a layer of stress-relieving tape wrapped about each end of the semi-conducting tape and an adjacent portion of the insulation; and an outer layer of electrical insulating tape covering all the previously-described tape layers and the turns of wire which are connected to ground through a fluorescent tube. When the insulated electrical conductor is subjected to live alternating current energization at 7000 volts or more, a capacitive alternating current path is established across the insulation, between the central conductor wire and the turns of wire acting as capacitor plates, to light the fluorescent tube.

8 Claims, 1 Drawing Sheet

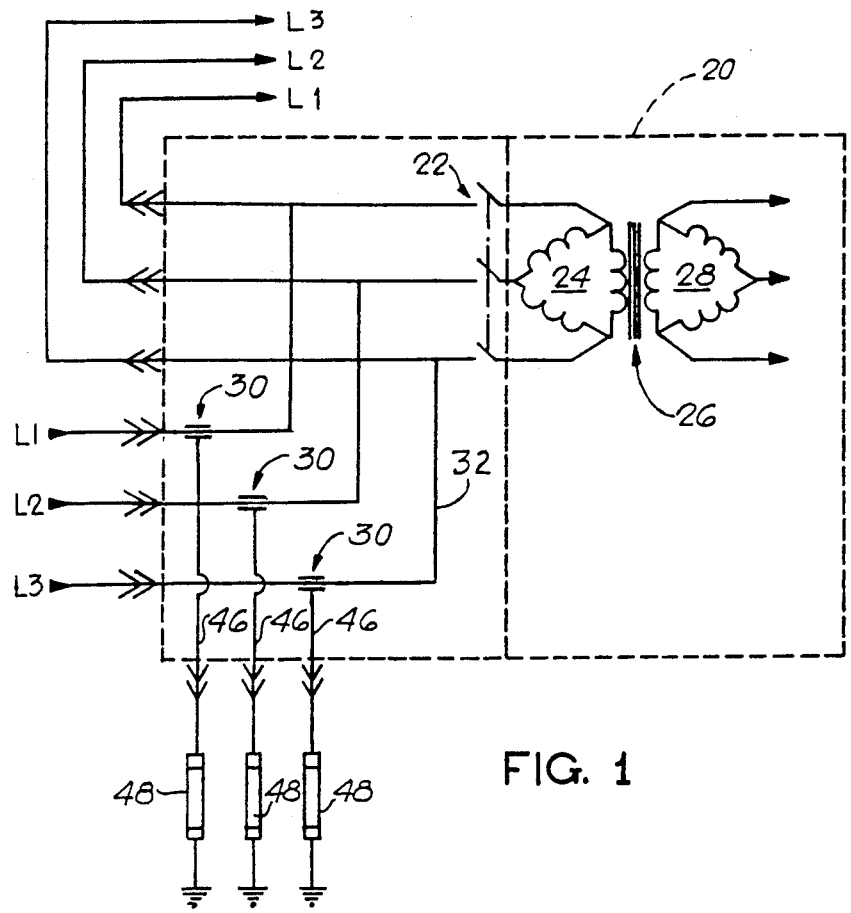
FIG. 1
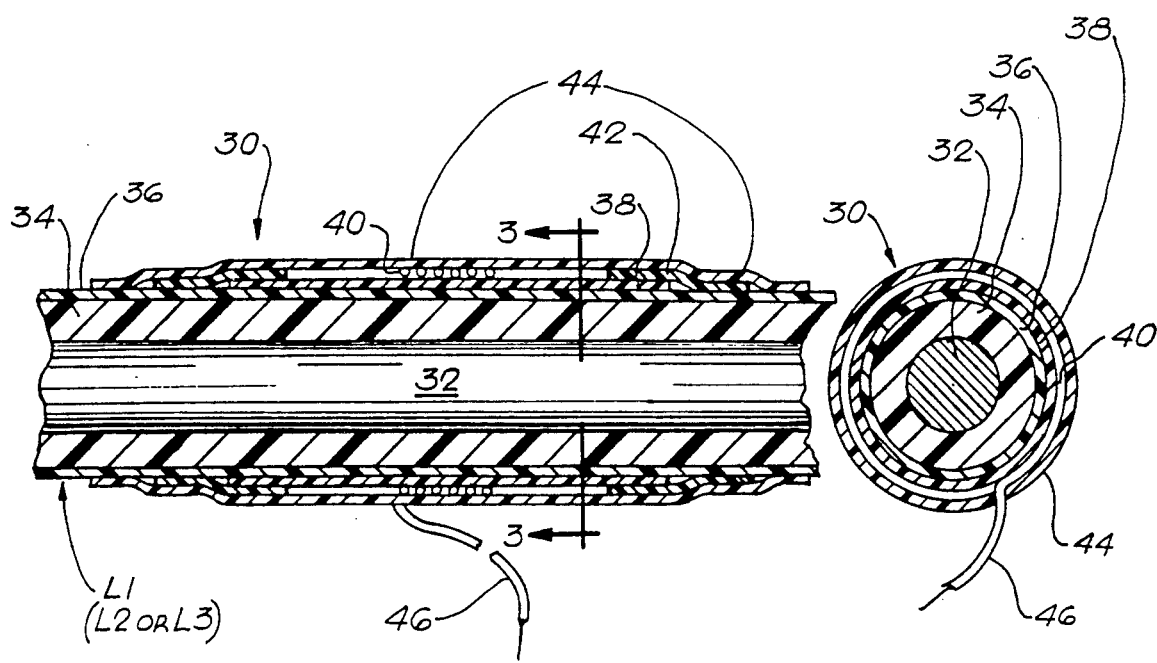
FIG. 2
FIG. 3

HIGH VOLTAGE INDICATOR DEVICE

CROSS REFERENCE TO RELATED APPLICATION

An application entitled "VOLTAGE PICKUP CIRCUIT AND FLASHING DISPLAY FOR HIGH VOLTAGE INDICATOR DEVICE, AND INPUT ELECTRODE THEREFOR" was filed 5/23/90 by Peter J. Green under Serial No. 527,584, and was assigned to the assignee of this application.

BACKGROUND OF THE INVENTION

The use of high voltage alternating current power distribution systems is accompanied by the risk that electrical maintenance personnel (and others) may inadvertently come into contact with energized conductors and be electrocuted or seriously injured.

In underground coal mines in the United States, the high voltage electrical distribution systems are radial in design and they are operated at voltages in the range of 4,160 to 15,000 V a.c. Power centers with transformers therein are located in active areas of the mine to transform the distribution voltage to suitable lower utilization voltages.

Because of the radial design of the underground high voltage distribution system, the high voltage sides of the power centers are typically of "feed-through" design. This means that the incoming high voltage supply cable is connected into the power center and loops directly out again to supply other power centers farther into the mine. An isolation switch on the primary side of each power center transformer can isolate the transformer from the high voltage supply, but the incoming and outgoing high voltage cables remain energized.

When the isolation switch on the primary side of any power center is in the "closed" position to energize the transformer, it is immediately evident to anyone in the vicinity that the equipment is energized. The transformer produces the distinctly audible "mains hum" associated with the magnetizing of the core steel and also various indicator lamps associated with the low voltage output circuits are lighted.

In contrast, when the isolation switch is in the "open" position to deenergize the transformer, there is no sound from the equipment, there are no indicator lights illuminated and usually there is no voltmeter to indicate whether or not the incoming distribution voltage is available. In fact, it is impossible to determine by visual or audible inspection whether the incoming supply is on or off. This situation has been a contributory factor in numerous accidents.

SUMMARY OF THE INVENTION

The present invention provides a simple, cost effective and reliable means of indicating that the incoming high voltage supply to a power center, switchhouse or similar piece of equipment is switched on.

The high voltage circuits inside a mine power center or switchhouse are connected by means of individual insulated conductors which are unshielded by any surrounding conductive layer. Consequently the electric field associated with high voltage energization of the conductor extends beyond the cable itself to other phase conductors and surrounding grounded surfaces within the power center enclosure. The invention makes use of these stray electric fields to provide an indication that the high voltage conductors are energized. In effect, a capacitor is constructed around the insulated conductor and this provides a high impedance circuit through a gas discharge lamp to ground. The current through the capacitor is sufficient to cause the discharge tube to glow when the high voltage circuit is energized, thus providing a visible warning to maintenance personnel.

The high voltage capacitor is constructed so the high voltage central wire conductor within the insulation forms one, inner electrode of the capacitor and a short length of the conductor insulation forms the principal dielectric of the capacitor.

The other, outer capacitor electrode is formed in situ by wrapping, for example, a layer about three inches long of semi-conducting tape around the cable insulation. A copper wire lead connection is made to this tape by wrapping several turns of a copper lead wire around it. Undesirable voltage stress concentrations at the ends of the layer of semi-conducting tape are prevented by wrapping a commercially available stress relieving tape over the ends of the semi-conducting tape and the adjacent portions of the conductor insulation. Finally a layer of standard insulation tape is wrapped overall to protect the underlying tapes and the turns of lead wire.

Typically, a capacitor sensor formed by the method described would be applied to each phase of a three phase circuit in the power center or switchhouse. In the simplest arrangement the three lead wires from the wire wraps constituting the outer capacitor electrodes are respectively connected to first terminals of three gas discharge tubes. The second terminals of the discharge tubes are connected to ground. The gas discharge tubes may be of fluorescent or neon types as desired.

The arrangement described has specific advantages over alternative means of achieving the same end using conventional components, as follows:

1) The invention does not involve any direct connection to the high voltage circuit.
2) No transformers are required.
3) No fuses are required.
4) Each of the three phases is independently monitored, providing some redundancy.
5) The number of components is low.
6) Component reliability is high.
7) Overall reliability is high.
8) The components required can readily be retrofitted to existing power centers.

The impedance of the capacitors is very high at power frequencies (60 $H_z$) and consequently the current available is at microampere levels.

However, at voltages of 7200 volts and above, the current is more than ample to provide adequate illumination in standard miniature fluorescent and neon tubes.

BRIEF DESCRIPTION OF THE DRAWINGS

Other objects and advantages will be apparent from the following description in connection with the drawings in which:

FIG. 1 is a schematic diagram showing a preferred form of the invention applied to each phase of a three phase distribution circuit supplying high voltage power to a power center in an underground coal mine;

FIG. 2 is an enlarged longitudinal cross-section of one of three capacitive sensors shown in FIG. 1; and FIG. 3 is a cross-section of FIG. 2, taken on line 3—3.

Like parts are designated by like reference characters throughout the drawings.

DESCRIPTION OF THE PREFERRED EMBODIMENT

Referring now more particularly to the drawings, a power center such as used in underground coal mines is indicated by the numeral 20, Typically, three-phase power at 7000–15,000 volts and 60 $H_z$ enters the power center enclosure 20 and loops directly out again to supply other power centers farther into the mine.

A three-phase isolation switch 22 supplies the primary 24 of a three phase transformer 26. Secondary 28 reduces the high distribution voltage to suitable lower utilization voltages.

Three outer capacitor electrodes 30 are formed in situ about each of the power distribution conductors L1, L2 and L3. Each power distribution conductor comprises a central conductive wire 32 and annular cross-section insulation 34. The insulation may or may not include an external protective jacket 36 which may be a tough, abrasion-resistant cover. Typically, the portions of the power distribution conductors inside the power center enclosure 20 will not have an electrically conductive shield.

The outer capacitor electrodes 30 may be identical. The outer capacitor electrode for power conductor L1 is shown in FIG. 2 and the method of forming it in situ will now be described, it being understood that the method of forming these electrodes for power conductors L2 and L3 will be the same.

Referring to FIG. 2, a layer of electrical semi-conducting tape 38 will be wrapped around the insulation 34 and jacket 36, typically extending about three inches along the length of the conductor. This length may be modified, depending on the voltage in the conductor. A higher voltage will require a shorter length to obtain the desired illumination level in the gas discharge tube. One example of an electrical semi-conducting tape which has been used with excellent results for this invention is marketed under the name "SCOTCH 13" and is available from electrical distributors, or from Electrical Products Division/3M, 225-4N 3M Center, St. Paul, Minn. 55144. This product is a ¾" wide, soft, black, highly-conformable ethylene propylene rubber (EPR)-based high-voltage splicing tape. It is non-vulcanizing and shelf-stable, characterized by consistent, low electrical conductivity over a wide temperature range up to 130° C.

An outer electrically conductive sheath is provided by several turns of a bare copper wire conductor lead 40 wrapped about the semi-conductive layer 38.

To prevent undesirable voltage stress concentrations at opposite ends of the semi-conducting tape 38, a suitable commercially available stress relieving tape is wrapped in a layer 42 over each end portion of the semi-conducting layer 38 and onto an adjacent surface portion of the insulation jacket 36. One such stress relieving tape is marketed under the name "SCOTCH 2220 Electrical Stress Control Tape" and is available from many electrical distributors or from Electrical Products Division/3M, St. Paul, Minn.

Finally, a layer of standard electrical insulation tape is wrapped in an outer layer 44 to cover the turns of wire conductor lead 40, and tape 42. One such tape is marketed under the name "SCOTCH 33 VINYL PLASTIC ELECTRICAL TAPE" and is also available from electrical distributors or Electrical Products Division/3M, St. Paul, Minn. An external lead 46 extends through the outer layer 44 as best shown in FIG. 3.

Each external lead 46 connects to ground through an indicator lamp 48. This may be a miniature fluorescent bulb or any suitable gas discharge bulb such as a neon bulb.

In operation, assume, by way of example, the distribution high voltage in lines L1, L2 and L3 is in the range of 7,200–15,000 volts at 60 Hz AC. In normal operation, the isolation switch 22 will be closed and the fact that the electrical components in the power center enclosure 20 are "alive" will be clearly evident by a distinctly audible "mains hum" and various indicator lamps (not shown) associated with the low voltage transformer secondary 28. Any one servicing the power center will therefore have adequate warning to take proper safety precautions before servicing any components inside the power center.

On the other hand, if the isolation switch 22 is opened, the "mains hum" disappears and the indicator lamps associated with the secondary 28 go out. Without the present invention, the distribution lines L1, L2 and L3 can be fully energized, with a lethal voltage, and there will be no indication of it. This has caused numerous accidents.

With the present invention, however, a capacitive alternating current path will be established across the insulation 34, between the central conductor wire 32 and the wire-turns sheath 40 functioning as capacitor electrodes. The actual current will be minuscule, in microamperes, but with the high voltages involved will be sufficient to illuminate each of the lamps 48 at a satisfactory level. This will provide a clear warning to any one servicing the equipment first to deenergize the distribution lines L1, L2 and L3, or take other safety precautions before opening the power center enclosure for servicing.

While a particular example of the present invention has been shown and described, changes and modifications may be made without departing from the invention in its broadest aspects. The aim of the appended claims, therefore, is to cover all such changes and modification included within the spirit and scope of the invention.

The embodiments of the invention in which an exclusive property or privilege is claimed are defined as follows:

1. Apparatus for indicating a live voltage condition in an insulated electrical conductor consisting of a central conductor wire with insulation thereon, said apparatus comprising:
   a layer of flexible semi-conducting tape wrapped continuously around the outer surface of the insulation;
   a flexible electrically conductive sheath wrapped continuously around the outer surface of the semi-conducting tape;
   a layer of flexible capacitive stress-relieving tape wrapped continuously around each end of the semi-conducting tape;
   an outer layer of flexible electrical insulating tape wrapped continuously around and completely covering the previously-described tape layers and the electrically conductive sheath; and
   electrical indicator means connected between said electrically conductive sheath and ground to provide an electrical signal when said central conductor wire is electrically energized.

2. Apparatus for indicating a live voltage condition in an insulated electrical conductor according to claim 1 in which said electrical indicator means is indicator lamp means to provide an illumination signal when the central conductor wire is electrically energized.

3. Apparatus for indicating a live voltage condition in an insulated electrical conductor consisting of a central conductor wire with insulation thereon, said apparatus comprising:
- a layer of flexible semi-conducting tape wrapped continuously around the outer surface of the insulation;
- a flexible electrically conductive sheath wrapped continuously around the outer surface of the semi-conducting tape;
- a layer of flexible capacitive stress-relieving tape wrapped continuously around each end of the semi-conducting tape and an adjacent portion of the insulation;
- an outer layer of flexible electrical insulating tape wrapped continuously around and completely covering the previously-described tape layers and the electrically conductive sheath; and
- electrical indicator means connected between said electrically conductive sheath and ground to provide an electrical signal when said central conductor wire is electrically energized.

4. Apparatus for indicating a live voltage condition in an insulated electrical conductor according to claim 3 in which the electrically conductive sheath comprises a plurality of turns of wire.

5. A method of indicating a live voltage condition in an insulated electrical conductor consisting of a central conductor wire with insulation thereon, said method of comprising the steps of:
   (a) wrapping a layer of flexible semi-conducting tape continuously around the outer surface of the insulation;
   (b) wrapping a flexible electrical conductor continuously around the outer surface of the semi-conducting tape;
   (c) wrapping a layer of flexible capacitive stress-relieving tape continuously around each end of the semi-conducting tape;
   (d) wrapping an outer layer of flexible electrical insulation tape continuously around and completely covering the previously-described tape layers and the electrical conductor; and
   (e) connecting the electrical conductor to an electrical indicator means.

6. A method of indicating a live voltage condition in an insulated electrical conductor consisting of a central conductor wire with insulation thereon, said method comprising the steps of:
   (a) wrapping a layer of flexible semi-conducting tape continuously around the outer surface of the insulation;
   (b) wrapping a flexible electrical conductor continuously around the outer surface of the semi-conducting tape;
   (c) wrapping a layer of flexible capacitive stress-relieving tape continuously around each end of the semi-conducting tape and an adjacent portion of the insulation;
   (d) wrapping an outer layer of flexible electrical insulating tape continuously around and completely covering the previously-described tape layers and the electrical conductor; and
   (e) connecting the electrical conductor to an electrical indicator means.

7. A method of indicating a live voltage condition in an insulated electrical conductor according to claim 6 in which the step of wrapping a flexible electrical conductor comprises wrapping a plurality of turns of wire continuously around the outer surface of the semi-conducting tape.

8. A method of indicating a live voltage condition in an insulated electrical conductor according to claim 6 in which the step of connecting the electrical conductor to an electrical indicator means comprises extending a wire from the flexible electrical conductor through the outer layer of insulating tape to an indicator lamp.

* * * * *